United States Patent [19]

Beazley et al.

[11] Patent Number: 4,547,724

[45] Date of Patent: Oct. 15, 1985

[54] METHOD AND APPARATUS FOR DETECTION OF NON-LINEAR ELECTRICAL DEVICES

[75] Inventors: Todd M. Beazley, Aloha; Calvin D. Diller, Beaverton, both of Oreg.

[73] Assignee: Tektronix, Inc., Beaverton, Oreg.

[21] Appl. No.: 464,796

[22] Filed: Feb. 7, 1983

[51] Int. Cl.⁴ ............................................. G01R 27/00
[52] U.S. Cl. ............................... 324/57 R; 324/158 D
[58] Field of Search ................ 324/57 R, 158 D, 132, 324/57 PS, 63, 65 R

[56] References Cited

U.S. PATENT DOCUMENTS 3,443,215  5/1969  Bradley .............................. 324/57 R
4,258,314  3/1981  Hirata ................................ 324/57 R Primary Examiner—Stanley T. Krawczewicz
Assistant Examiner—Jack B. Harvey
Attorney, Agent, or Firm—Allston L. Jones; George T. Noe

[57] ABSTRACT

The present invention provides a system for applying a fixed level D.C. voltage and a square wave signal sequentially to a voltage divider including a resistor of a known impedance and the device under test. The square wave ranges from a value which is substantially equal to the ground level to a level that is substantially twice the nominal value of the fixed D.C. level, thus the average value of the square wave signal is substantially equal to the nominal value of the fixed level D.C. voltage.

With each of these signals applied on at a time to the voltage divider, the voltage across the device under test is applied to a voltage detector via a low pass filter. The output of the low pass filter for each applied voltage signal is the average of the voltage signal which appears across the device under test. The value of these average voltages are stored and then compared. If the average values are substantially equal, then the device under test is linear, and knowing the average voltage value, the nominal voltage value, and value of the known resistor, the resistance value of the device under test can be calculated. If the average values of the voltages across the device under test varies from the application of the fixed level D.C. voltage and the square wave signal, the device under test is non-linear, e.g. a diode or transistor junction.

4 Claims, 9 Drawing Figures

METHOD AND APPARATUS FOR DETECTION OF NON-LINEAR ELECTRICAL DEVICES

BACKGROUND AND SUMMARY OF THE INVENTION

The present invention relates to impedance measurement and more particularly to the automatic measurement of linear impedances and the detection of non-linear electrical devices.

Electrical ohmmeters are frequently used to make measurements 'in circuit' where various combinations of passive and semiconductor devices are interconnected. Many ohmmeters are capable of forward biasing semiconductor junctions so that measurement of resistance across such a junction becomes tedious. At least two readings must be taken even to determine that a junction is being forward biased and then a decision must be made as to which is the desired reading. Stated another way, conventional ohmmeters require active operator involvement in the determination of whether a non-linear device is present, leaving room for measurement error. Furthermore, evaluation of such a device usually requires switching to a different mode or range.

In accordance with the illustrated embodiment, the present invention automatically checks the device(s) under test for non-linearity and if a linear resistance measurement is impossible, an appropriate message is generated and the device forward voltage drop is displayed. If the device under test is linear, the most valid measurement will be displayed. As will be seen in the following discussion, the present invention makes the measurements automatically, thus minimizing both front panel and measurement complexity without the necessity of the operator needing to change modes or making the ultimate determination that the device is non-linear.

The present invention includes a method and apparatus for determining whether a device under test is linear or non-linear and for calculating the impedance of the device under test if it is linear. The device under test is serially interconnected with a linear device of a known value to form a voltage divider. A fixed D.C. voltage and a positively going square wave signal having an average value that is substantially equal to the value of the D.C. voltage are alternately applied to the voltage divider. For each of these applied signals, the average value of the voltage across the device under test is measured and their values compared. If the compared values are substantially different, then the device under test is identified as a non-linear device. If the compared values are substantially equal, then the device is linear and its impedance value may be calculated using the standard voltage divider formula since the value of linear device in the divider is known, as is the nominal value of the two applied signals, and the average value of the voltage across the device under test has been measured.

DESCRIPTION OF THE PREFERRED EMBODIMENT

Figure 1:
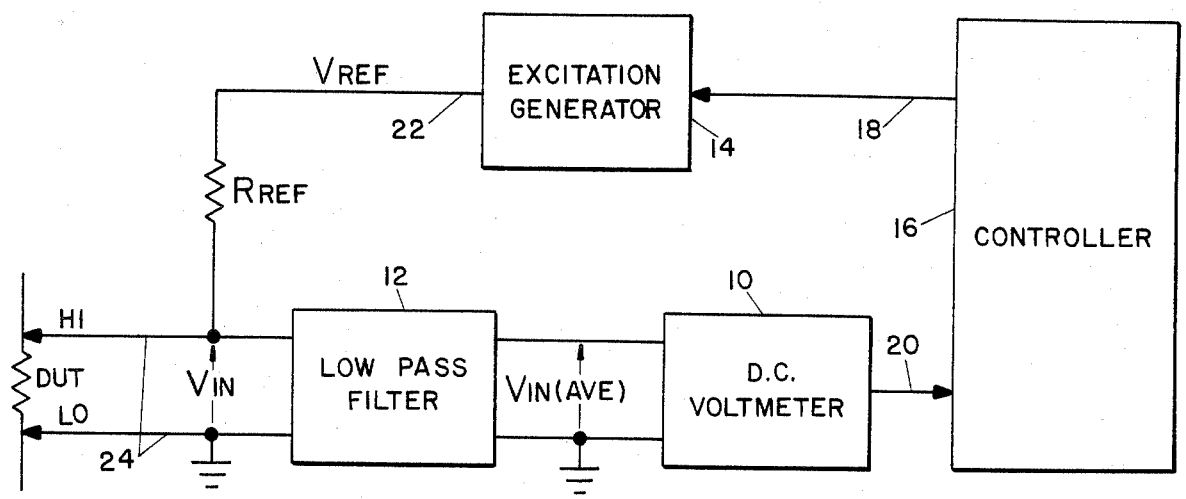
FIG. 1 is a simplified block diagram of the embodiment of the preferred present invention.

Referring to FIG. 1 there is shown a simplified block diagram of the impedance measurement circuit of the present invention. The circuit includes a DC voltmeter 10 preceded by a low pass filter 12, a reference resistor, $R_{REF}$, an excitation generator 14 capable of generating the waveforms shown in FIGS. 2 and 3, and a controller 16 capable of interpreting voltmeter readings, exercising control over the excitation generator, and performing calculations for the display of resistance.

Figure 2:
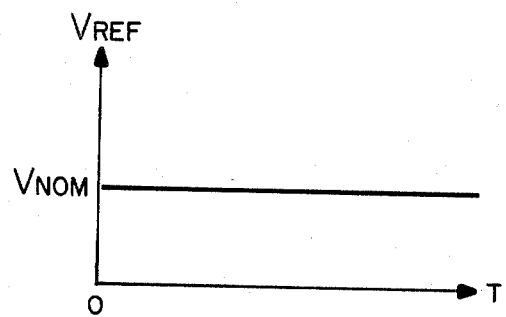
FIG. 2 is a graphical representation of the $V_{REF}$ signal when the control signal is in one state (low).

Together these blocks function to measure resistance of the device under test (DUT) connected to test leads 24. This is accomplished by setting the controller 16 control signal low and applying it to excitation generator 14 via line 18 resulting in the DC drive to $R_{REF}$ being equal to $V_{NOM}$ (FIG. 2). $R_{REF}$ forms a common voltage divider with the resistive portion of DUT, and $V_{IN}$ will therefore be some fraction of $V_{NOM}$. $V_{IN}$ is read through the low pass filter 12 by the DC voltmeter 10 and the output of voltmeter 10 is fed to the controller 16. Knowing the values of $R_{REF}$, $V_{IN}$ and $V_{NOM}$, the controller 16 calculates the value of DUT.

Figure 3:
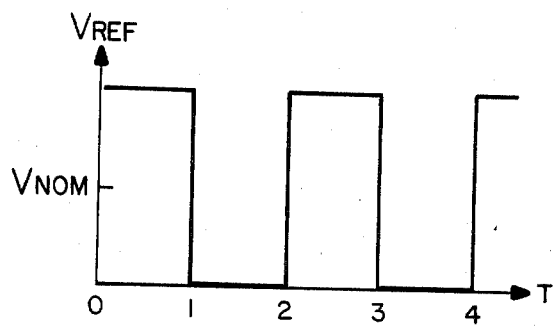
FIG. 3 is a graphical representation of the $V_{REF}$ signal when the control signal is in a second state (high).

If DUT is linear (exhibits linear changes in terminal voltage for changes in bias current, i.e. resistive), then setting the control signal from controller 16 high and applying it to excitation generator 14 via line 18 causes generator 14 to initiate a rectangular waveform as in Figure 3 on line 22 for $V_{REF}$. This signal will have no effect on the resistance calculated by the controller 16 so long as DUT is linear. This is true because the squarewave of FIG. 3 has an average value equal to $V_{NOM}$. Since DUT is linear, the average value of $V_{IN}$ will be the same for the squarewave excitation as in the previous case with the steady state voltage. The low pass filter 12 will remove the alternating components from the squarewave $V_{IN}$ leaving only the DC average value to be read by the DC voltmeter 10. To summarize, if DUT is linear, changing the control signal from low to high (changing $V_{REF}$ from fixed value to a square wave) will have no effect on the measured resistance.

Figure 4:
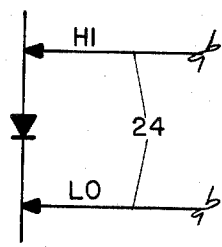
FIG. 4 is illustrative of the connection of a diode under test to the test leads.

The invention is also capable of detecting a non-linear DUT. This is possible because of the instantaneous voltage excursions of $V_{REF}$ when the control signal is high (see FIG. 3). For example, consider a silicon diode connected to test leads 24 as shown in FIG. 4. When the instantaneous value of $V_{REF}$ is high, the diode will be forward biased, clamping $V_{IN}$ to about 0.65 volts. When $V_{REF}$ is low (very close to zero volts), no conduction will occur in the diode and $V_{IN}$ will equal zero. $V_{IN}$ will then be a rectangular wave with a positive peak of about 0.65 volts and a negative peak of about zero yielding an average value somewhere in between (depending on the duty factor of the signal). When the control signal is low, the $V_{REF}$ will equal $V_{NOM}$ and if $V_{NOM}$ is selected to be greater than a volt, $V_{IN}$ will again be clamped to 0.65 volts, the forward drop of the diode. Since the conditions are now static, the average value of $V_{IN}$ is also 0.65 volts. To summarize for the case of the diode, a low control signal results in a different average value for $V_{IN}$ (as seen by voltmeter 10) than does a high control signal. This changing reading is sensed by the controller 16 and appropriate messages are displayed to advise the operator that DUT is non-linear.

The basis of the invention is in the use of the voltage divider connection scheme of $R_{REF}$ and DUT for resistance measurement in combination with selectable excitation voltage waveforms for the purpose of detecting the presence of non-linear devices.

Figure 5:
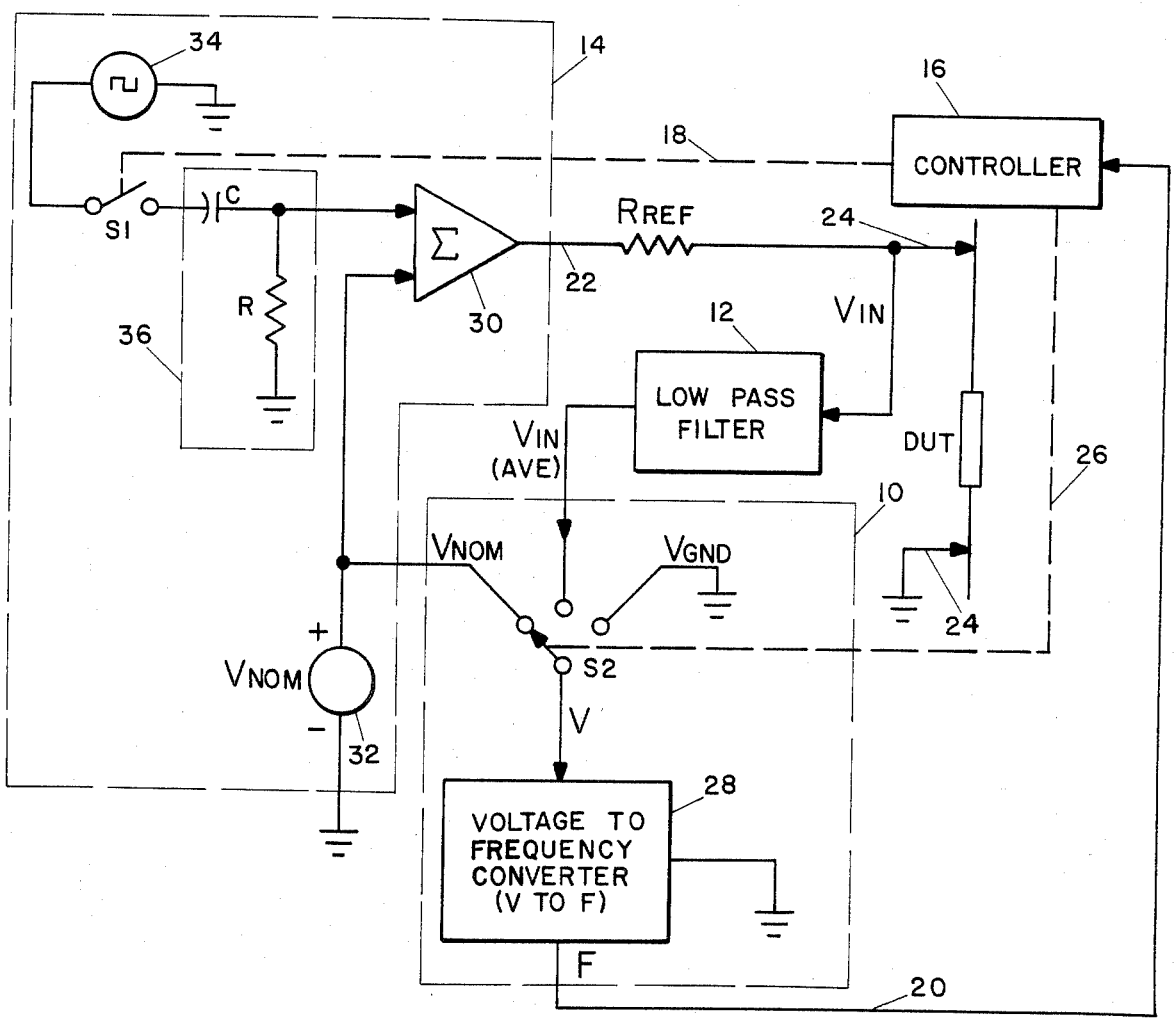
FIG. 5 is a block diagram of the present invention of FIG. 1 with several of the blocks indicating specific circuits.

Referring next to FIG. 5 there is shown a more detailed embodiment of the present invention wherein each element that is the same as in FIG. 1 is indicated with the same reference number or designator. In this figure, the DC voltmeter 10 includes switch S2 and a voltage to frequency converter 28, the details of excitation generator 14 are shown, and controller 16 interface to switches S1 and S2 is shown by broken lines 18 and 26.

The major difference between the circuits of FIG. 5 and FIG. 1 is the inclusion of a voltage to frequency converter 28 in DC voltmeter 10. Since there could be an offset of the output frequency from the measured voltage, it is necessary to have converter 28 measure $V_{nom}$ and $V_{gnd}$, in addition to $V_{in}$ through low pass filter 12.

First assume that DUT is a resistance which we will call RUT. With switch S1 open, the D.C. nominal voltage, $V_{nom}$ is the only voltage applied to voltage summer 30. $R_{REF}$ and RUT (DUT) form a voltage divider with $V_{in}$ being a fraction of $V_{nom}$. While controller 16 maintains S1 in the open position, it switches S2 sequentially between the three positions to serially input $V_{nom}$, $V_{in(ave)}$ and $V_{gnd}$ to converter 28. Converter 28 converts each voltage to a corresponding frequency $F_x$ which it then transmits to controller 16. Controller 16 stores each of these signals for calculating the value of RUT.

The transfer function of converter 28 is as shown in equation (1)

$$F_x = F_o - KV_x (F_o > KV_x) \quad (1)$$

where
$F_x$ is the output frequency,
$V_x$ is the input voltage, and
$F_o$ and $K$ are constants.
Solving equation (1) for $V_x$ we get $$V_x = (F_o - F_x)/K \quad (2)$$

The standard voltage divider formual solved for RUT is:

$$RUT = R_{REF}[(V_{in} - V_{gnd})/(V_{nom} - V_{in})] \quad (3)$$

Then plugging equation (2) into equation (3) yields $$RUT = R_{REF}[(F_{gnd} - F_{in})/(F_{in} - F_{nom})] \quad (4)$$

To check to see if DUT is a diode, controller 16 closes switch S1, thus applying the output voltage from square wave generator 34 to the second input of voltage summer 30 via R-C filter 36. The square wave signal is therein superimposed on the $V_{REF}$ DC voltage (see FIG. 3). The combined signal is then applied to DUT via $R_{ref}$.

Since the square wave is coupled through a capacitor C of filter 36, there will be no net shift in the average DC level applied to $R_{ref}$ from that in the steady state. Also, the time constant of the filter 36 is selected so that it is large enough so that the square wave is not appreciably differentiated. The square wave amplitude is such that the output of the summer 30 will swing all the way to ground (see FIG. 3).

Figure 6:
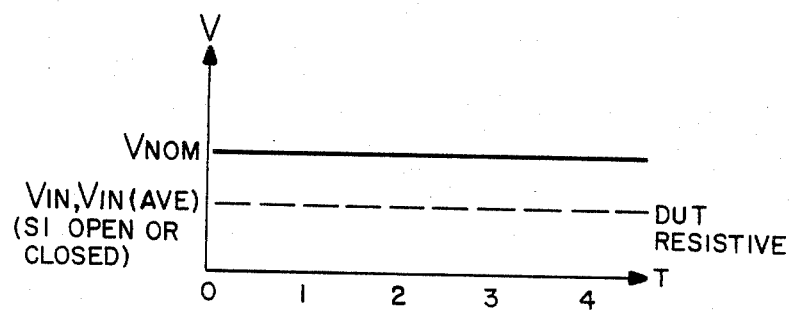
FIG. 6 is a graphical representation of $V_{in}$ and $V_{in(ave)}$ for a resistive DUT with S1 of FIG. 5 either open or closed.
Figure 7:
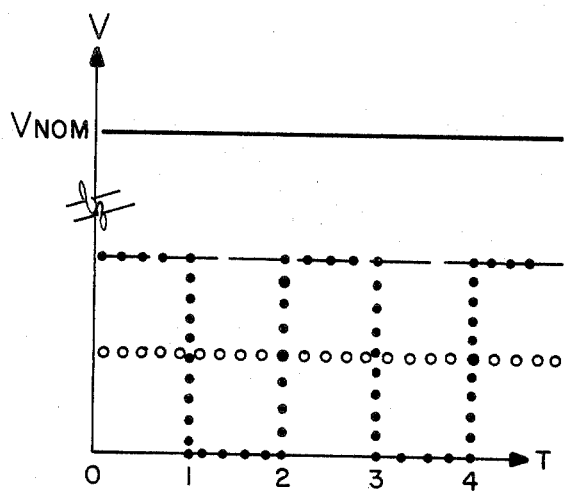
FIG. 7 is a graphical representation of $V_{in}$ and $V_{in(ave)}$ for a diode DUT with S1 of FIG. 5 open and closed.

As discussed with respect to FIGS. 1-4, if DUT is resistive, then $V_{in(average)}$ from low-pass filter 12 will have the same value with switch S1 closed, as it did with switch S1 open. However, if DUT is a diode with its anode connected to $R_{ref}$, $V_{in(ave)}$ will have a different value for each position of switch S1 as discussed above with respect to FIGS. 1-4. FIGS. 6 and 7 show the relationship between $V_{in}$ and $V_{in(ave)}$ for switch S1 open and closed for DUT being a resistor and a diode, respectively. In FIG. 7 if DUT is a silicon diode, $V_{in}$ and $V_{in(ave)}$ with S1 open will be typically 0.65 V, and $V_{in(ave)}$ with S1 closed will be typically 0.32 V with $V_{nom}$ greater than 1 VDC. Typically $V_{nom}$ will be 2.5 VDC.

In optimizing the circuit of FIG. 5 it must be kept in mind that the time constant of the R-C network of filter 36 must be such that the square wave signal from source 34 is not differentiated and so that the settling time after S1 is switched is not excessive. This is particularly important in automated systems. However, if the R-C time constant is too short, the square wave signal will be distorted. In such a situation, a clamping circuit would be necessary so that the output signal level from voltage summer 30 is substantially at ground level during one-half of its cycle thus insuring that if DUT is a diode it will turn off during those periods.

The frequency of the square wave signal from source 34 can also be a factor in not being able to detect whether DUT is a diode or resistor. Some diodes have a relatively large parallel capacitance, thus if the frequency of the square wave is sufficiently high, that capacitance will attenuate the minimum level, as well as the maximum level, of the square wave across DUT and prevent the diode from being turned off (i.e. $V_{in}$ will never go to zero). For this reason the square wave frequency should be minimized.

There is another important practical consideration when implementing the present invention. In an actual measurement system, DUT (whether or not it is a diode) will be connected and disconnected at random with respect to the automatic measurement sequence. It is therefore possible to make the system think that it has detected a diode, by connecting and disconnecting a resistor when the system is trying to measure $V_{in}$. For example, if DUT (a resistor) is connected while the system is measuring $V_{in}$ with S1 open, then if DUT is disconnected while the system is measuring $V_{in}$ with S1 closed, the system will detect a shift in the average $V_{in}$ value, and will erroneously indicate that DUT is a diode.

Figure 8:
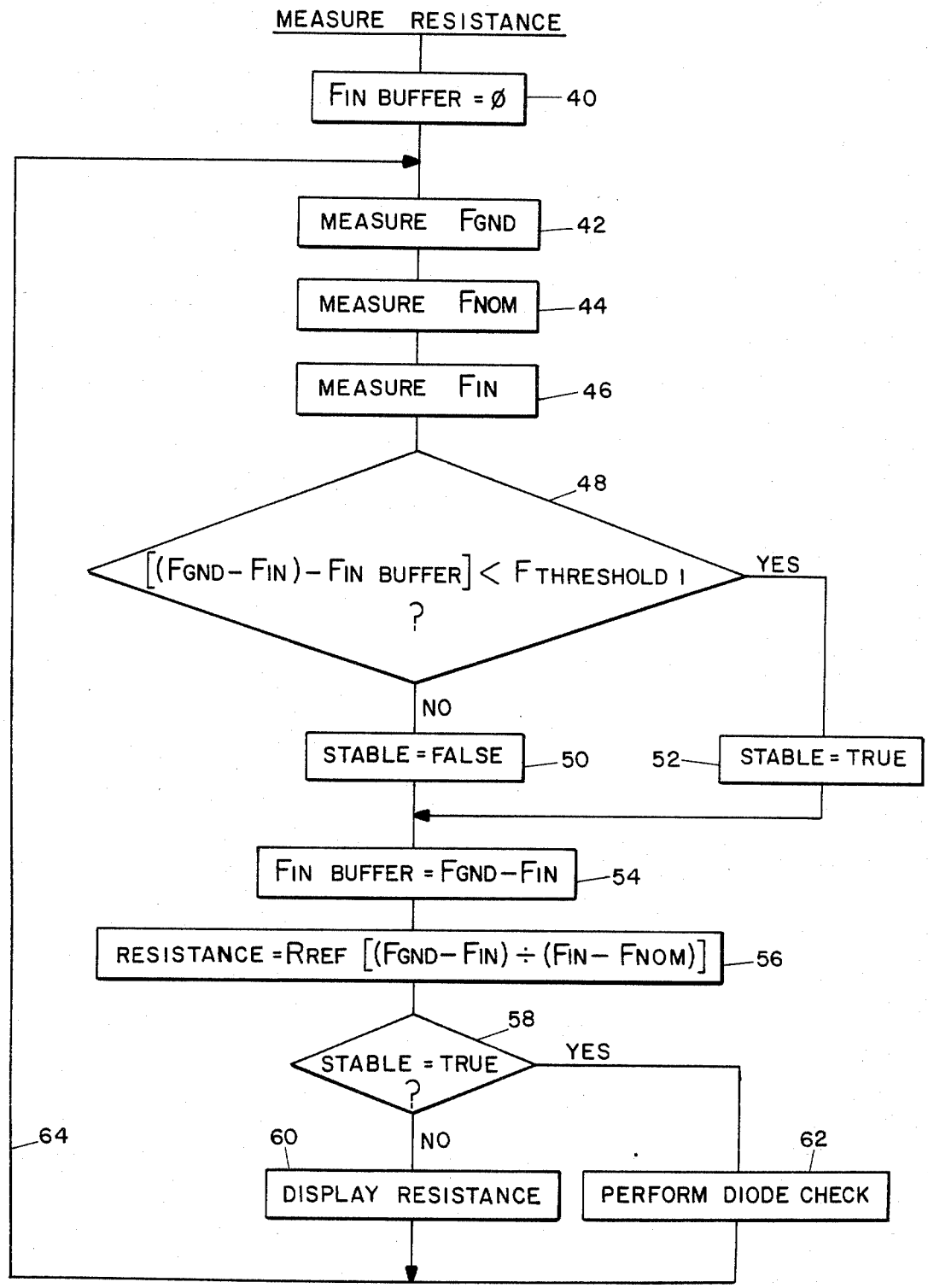
FIG. 8 is a flow diagram of a resistive measurement method to insure that a resistor is not misidentified as a diode.

To overcome this, the measurement system controller 16 must first determine that $V_{in}$ (with S1 open) has stabilized, by comparing successive $V_{in}$ ($F_{in}$) measurements (see Figure 8). As long as $F_{in}$ has not stabilized, the system will calculate and display the apparent resistance of DUT. When the system detects that two successive measurements of $F_{in}$ are sufficiently close, it will perform diode check 62.

Figure 9:
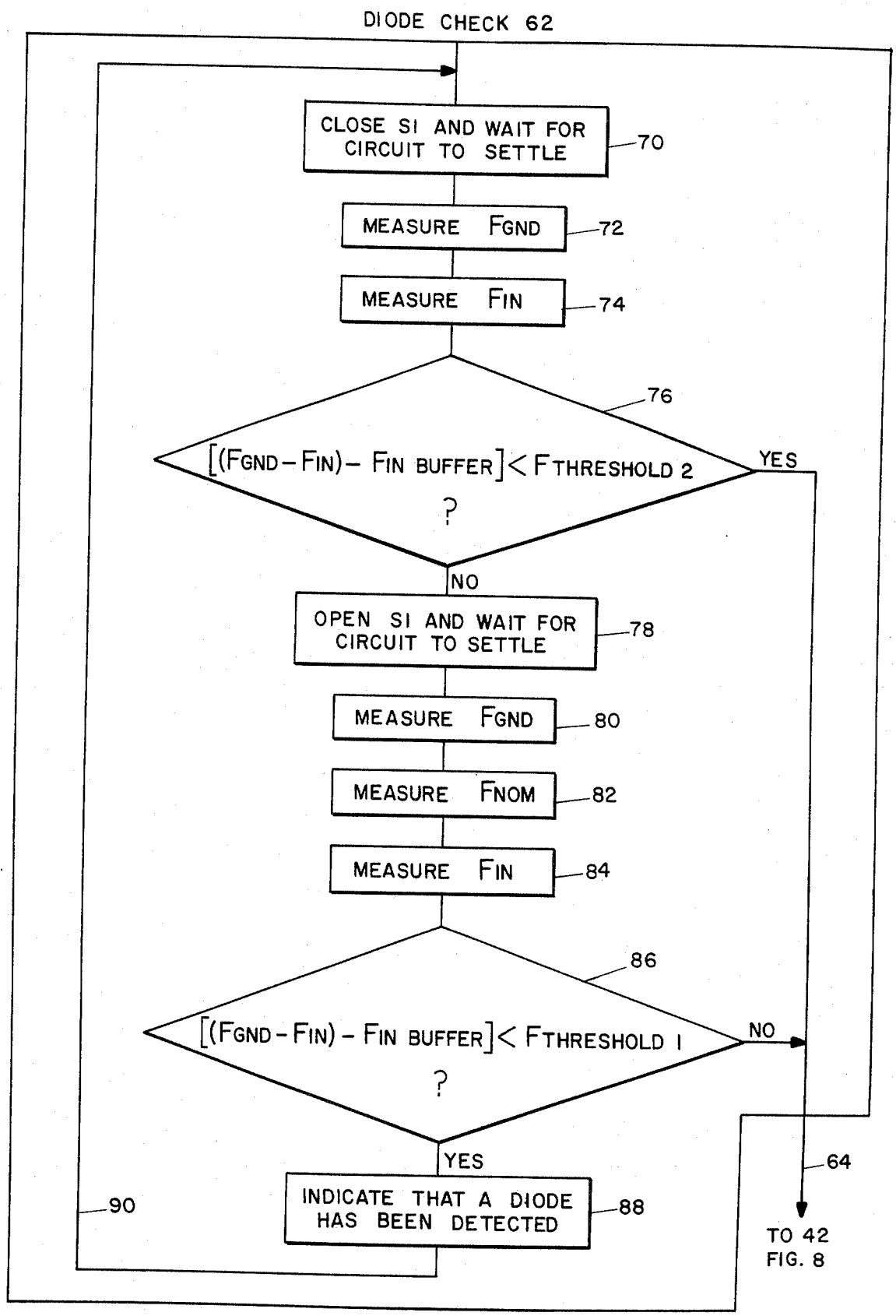
FIG. 9 is a flow diagram fully identifying the steps of the "Perform Diode Check'" step of FIG. 8.

Referring next to FIGS. 8 and 9 there can be seen flow diagrams of the control, calculation and decision functions performed by controller 16 as DUT is measured. Before describing the flow charts it should be mentioned that $F_{threshold\ 1}$ (FIG. 8) is introduced to determine the system's sensitivity to variations of $V_{in(ave)}$ with S1 open. As the value of $F_{threshold\ 1}$ is reduced, $V_{in(ave)}$ must also become more stable before the system will check for a diode. Similarly, $F_{threshold\ 2}$ (FIG. 9) determines the system's sensitivity to variations in $V_{in(ave)}$ due to the non-linearity of DUT. That is as $F_{threshold\ 2}$ is made smaller, DUT can be more linear, and still be detected as a diode. The limit to the smallness on $F_{threshold\ 2}$ is dependent of the inherent noise and nonlinearity in the measurement system. For optimum performance, it has been observed that $F_{threshold\ 1}$ should be somewhat smaller than $F_{threshold\ 2}$.

In FIG. 8 the control, calculation and decision functions of controller 16 with regard to resistance measurement are shown by means of a flow chart. In step 40 an internal control value of $F_{in\ buffer}$ is set equal to zero. Next, controller 16 receives values of $F_{gnd}$ (block 42), $F_{nom}$ (block 44), and $F_{in}$ (block 46) sequentially from voltage to frequency converter 28 by means of manipulating switch S2 to input voltages $V_{nom}$, $V_{in(ave)}$ and $V_{gnd}$ to converter 28. Using these values in decision block 48 controller 16 calculates the quantity $F_{gnd} - F_{in}$ from which the quantity $F_{in\ buffer}$ is subtracted and then the absolute value of the final quantity is determined. This absolute value is then tested to see if it is less than the preselected value of $F_{threshold\ 1}$. If the condition is not true the internal control variable STABLE is set false (block 50). If the condition in block 48 is true then the internal control variable STABLE is set true (block 52). Flow continues from either of blocks 50 or 52 with the setting of the internal control variable $F_{in\ buffer}$ equal to $F_{gnd} - F_{in}$ (block 54). Next the resistance of DUT is calculated as per equation 4 at block 56. Next controller 16 makes a decision at block 58 as to whether a diode check is to be performed. To make this decison the internal control variable STABLE is tested to see if it is equal to true. If it is not, the resistance value calculated at block 56 is displayed (block 60). If STABLE is equal to true then block 58 is true and the diode check of block 62 will be performed. Following the display of the resistance value at block 60 or the diode check at block 62 the calculations are restarted by measuring the next values of $V_{nom}$, $V_{in(ave)}$ and $V_{gnd}$ to generate the values $F_{gnd}$ and $F_{nom}$ and $F_{in}$ of blocks 42, 44 and 46, restarting the cycle. If the internal control variable STABLE was false the first time through and there has been no action taken by the operator to disconnect the DUT in the meantime, the next time the test is performed at block 48 the result should be true and therefore the internal control variable STABLE should be set equal to true. Then the diode check will be performed as the test progresses (block 62).

The full detail of the diode check of block 62 is shown by means of a flow chart in FIG. 9. Controller 16 first closes switch S1 (FIG. 5) and waits for settling of that circuit (block 70). Next, the values of $F_{gnd}$ and $F_{in}$ at blocks 72 and 74, respectively, are measured by controller 16 controlling switch 2 and measuring $V_{gnd}$ and $V_{in(ave)}$ and converting those voltages to corresponding frequencies via converter 28. Next is decision block 76 in which it is indicated that controller 16 first subtracts $F_{in}$ from $F_{gnd}$ and then from that result subtracts $F_{in\ buffer}$. By reviewing block 54 of FIG. 8 we note that the value of $F_{in\ buffer}$ represents a previously measured difference between $F_{gnd}$ and $F_{in}$. Thus if the absolute value of the difference of these two quantities in decision block 76 is less than $F_{threshold\ 2}$ DUT cannot be a diode. Therefore, control is returned via line 64 to block 42 of FIG. 8. If this condition is not met, however, it is possible that DUT is a diode. To make a final determination, another measurement check is required. From decision block 76 if the condition is not met, controller 16 opens switch S1, allows sufficient time for the circuit to settle (block 78), and then remeasures the quantities $F_{gnd}$, $F_{nom}$, and $F_{in}$ (blocks 80–84) as discussed above. The value of $F_{in}$ is again subtracted from the value of $F_{gnd}$, and from this result, is subtracted the previous value of $F_{in\ buffer}$. The absolute value is then taken of that result and it is tested to see if it is less than $F_{threshold\ 1}$. If this condition is not met, DUT is not a diode and control is returned via line 64 to block 42 of FIG. 8. If the condition is met, then controller 16 provides an indication to the user that a diode has been detected (block 88). Following this indication control is then returned via line 90 to block 70 of FIG. 9 for testing to continue.

While the preferred algorithm for non-linear device detection depends on shifts in the output frequency of the system voltage to frequency converter, other parameters (i.e. input terminal voltage shift or shifts in calculated resistance) may be used instead. Similarly, other means of conversion (than voltage to frequency) may be employed. The excitation waveform and circuit may also vary substantially in practice while still achieving successful diode detection. Such variations will be apparent to those skilled in the art.

We claim:

1. A method for detecting linear and non-linear electrical characteristics in a device under test, comprising the steps of:
    (a) connecting said device under test in series with a reference device having a known impedance value and a linear electrical characteristic thereby to form a voltage divider;
    (b) applying a substantially fixed DC voltage across said voltage divider;
    (c) measuring the DC voltage value across said device under test in response to said fixed DC voltage in step (b);
    (d) applying a positively going, substantially square wave voltage signal having an average voltage that is substantially equal to the fixed DC voltage applied across said voltage divider;
    (e) measuring the average voltage value across said device under test in response to said square wave voltage signal in step (d); and
    (f) comparing the DC voltage value measured in step (c) with the average voltage value measured in step (e), wherein said device under test is determined to be linear if said compared values are substantially equal and non-linear if said compared values are substantially different.

2. A method in accordance with claim 1 further comprising the step of calculating the impedance value of the device under test if said compared values are substantially equal.

3. An apparatus for detecting linear and non-linear electrical characteristics in a device under test, comprising:

means for connecting said device under test in series with a reference device having a known impedance value and a linear electrical characteristic thereby to form à voltage divider;

means for applying a substantially fixed DC voltage across said voltage divider;

means for measuring the DC voltage value across said device under test in response to said fixed DC voltage;

means for applying a positive going square wave voltage signal having an average voltage that is substantially equal to said fixed DC voltage applied across said voltage divider;

means for measuring the average voltage value across said device under test in response to said square wave voltage signal; and means for comparing the DC voltage value measured across said device under test with the average voltage value also measured across said device under test, wherein said device under test is determined to be linear if said compared values are substantially equal and non-linear if said compared values are substantially different.

4. An apparatus in accordance with claim 3 further comprising means for calculating the impedance value of the device under test if said compared values are substantially equal.

* * * * *